United States Patent
Choi et al.

(10) Patent No.: US 6,870,301 B2
(45) Date of Patent: Mar. 22, 2005

(54) METHOD OF SEPARATING A TEMPLATE FROM A SUBSTRATE DURING IMPRINT LITHOGRAPHY

(75) Inventors: Byung Jin Choi, Round Rock, TX (US); Sidlgata V. Sreenivasan, Austin, TX (US); Stephen C. Johnson, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 10/617,321

(22) Filed: Jul. 10, 2003

(65) Prior Publication Data

US 2004/0104641 A1 Jun. 3, 2004

Related U.S. Application Data

(62) Division of application No. 09/698,317, filed on Oct. 27, 2000.
(60) Provisional application No. 60/162,392, filed on Oct. 29, 1999.

(51) Int. Cl.$^7$ .............................................. B41M 5/00
(52) U.S. Cl. ................... 310/311; 101/463.1; 430/320
(58) Field of Search ...................... 310/311; 430/272.1, 430/302, 275.1, 320; 101/473, 463.1

(56) References Cited

U.S. PATENT DOCUMENTS

| | | | |
|---|---|---|---|
| 4,326,805 A | | 4/1982 | Feldman et al. |
| 4,552,832 A | * | 11/1985 | Blume et al. ............... 430/320 |
| 4,724,222 A | | 2/1988 | Feldman et al. |
| 4,909,151 A | * | 3/1990 | Fukui et al. .............. 101/450.1 |
| 6,696,220 B2 | * | 2/2004 | Bailey et al. ............. 430/272.1 |
| 2002/0094496 A1 | * | 7/2002 | Choi et al. ................... 430/322 |

FOREIGN PATENT DOCUMENTS

| | | | | |
|---|---|---|---|---|
| JP | 58-129074 | * | 8/1983 | ................. 101/473 |
| JP | 4-70379 | * | 5/1992 | ............ B41M/5/26 |

OTHER PUBLICATIONS

Feldman et al., "Wafer Chuck for Magnification correction in X-ray Lithography," Journal of Vacuum Science and Technology, Nov./Dec. 1998, pp. 3476–3479, vol. B 16(6).

* cited by examiner

*Primary Examiner*—Thomas M. Dougherty
(74) *Attorney, Agent, or Firm*—Kenneth C. Brooks

(57) ABSTRACT

Processes and associated devices for high precision positioning of a template an substrate during imprint lithography includes a calibration system with a course calibration stage and a fine orientation stage capable of maintaining a uniform gap between the template and substrate. The fine orientation stage includes a pair of flexure members having flexure joints for motion about a pivot point intersected by first and second orientation axes. Actuators lengthen or shorten to expand or contract the flexure members. Separation of the template is achieved using a peel-and-pull method that avoids destruction of imprinted features from the substrate.

22 Claims, 14 Drawing Sheets

METHOD OF SEPARATING A TEMPLATE FROM A SUBSTRATE DURING IMPRINT LITHOGRAPHY

CROSS-REFERENCE TO RELATED APPLICATIONS

The present application is a divisional of U.S. patent application Ser. No. 09/698,317 filed on Oct. 27, 2000 entitled "High Precision Orientation Alignment and Gap Control Stages for Imprint Lithography Process," which claims priority to U.S. Provisional Patent Application No. 60/162,392 filed on Oct. 29, 1999 entitled "Method and Device for Precise Gap Control and Overlay Alignment During Semiconductor Manufacturing," both of which are incorporated by reference herein.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of N66001-98-1-8914 awarded by the Defense Advanced Research Projects Agency (DARPA).

TECHNICAL FIELD

The invention relates in general to techniques for small device manufacturing and specifically, to a system, processes and related devices for high precision imprint lithography enabling the manufacture of extremely small features on a substrate such as a semiconductor wafer. More specifically, the invention relates to methods and components for the orientation and alignment of a template about a substrate as well as their separation without destruction of imprinted features.

BACKGROUND OF THE INVENTION

Without limiting the invention, its background is described in connection with a process for the manufacture of sub-100 nm devices using imprint lithography.

In manufacturing, lithography techniques that are used for large-scale production include photolithography and other application oriented lithography techniques such as electron beam lithography, ion-beam and x-ray lithography, as examples. Imprint lithography is a type of lithography that differs from these techniques. Recent research has shown that imprint lithography techniques can print features that are smaller than 50 nm. As such, imprint lithography has the potential to replace photolithography as the choice for semiconductor manufacturing in the sub-100 nm regime. It can also enable cost effective manufacturing of various kinds of devices including patterned magnetic media for data storage, micro optical devices, MEMS, biological and chemical devices, X-ray optical devices, etc.

Current research in the area of imprint lithography has revealed a need for devices that can perform orientation alignment motions between a template, which contains the imprint image, and a substrate, which receives the image. Of critical importance is the careful and precise control of the gap between the template and substrate. To be successful, the gap may need to be controlled within a few nanometers across the imprinting area while, at the same time, relative lateral motions between template and substrate must be eliminated. This absence of relative motion leads to also preferred since it allows for a complete separation of the gap control problem from the overlay alignment problem.

For the specific purpose of imprinting, it is necessary to maintain two flat surfaces as close to each other as possible and nearly parallel. This requirement is very stringent as compared to other proximity lithography techniques. Specifically, an average gap of about 100 nm with a variation of less than 50 nm across the imprinted area is required for the imprint process to be successful at sub-100 nm scales. For features that are larger, such as, for example MEMS or micro optical devices, the requirement is less stringent. Since imprint processes inevitably involve forces between the template and the wafer, it is also desirable to maintain the wafer surface as stationary as possible during imprinting and separation processes. Overlay alignment is required to accurately align two adjacent layers of a device that includes multiple lithographically fabricated layers. Wafer motion in the x-y plane can cause loss of registration for overlay alignment.

Prior art references related to orientation and motion control include U.S. Pat. No. 4,098,001 entitled "Remote Center Compliance System", U.S. Pat. No. 4,202,107 entitled "Remote Axis Admittance System", both by Paul C. Watson, and U.S. Pat. No. 4,355,469 entitled "Folded Remote Center Compliant Device" by James L, Nevins and Joseph Padavano. These patents relate to fine decoupled orientation stages suitable for aiding insertion and mating maneuvers in robotic machines, docking and assembly equipment. The similarity between these prior art patents and the present invention are in the provision for deformable components that generate rotational motion about a remote center. Such rotational motion is generated, for example, via deformations of three cylindrical components that connect an operator and a subject in parallel.

The prior art patents do not, however, disclose designs with the necessary high stiffness to avoid lateral and twisting motions. In fact, such lateral motion is desirable in automated assembly to overcome mis-alignments during the assembly process. Such motion is highly undesirable in imprint lithography since it leads to unwanted overlay errors and could lead to shearing of fabricated structures. Therefore, the kinematic requirements of automated assembly are distinct from the requirements of high precision imprint lithography. The design shown in U.S. Pat. No. 4,355,469 is intended to accommodate larger lateral and rotational error than the designs shown in the first two patents, but this design does not have the capability to constraint undesirable lateral and twisting motions for imprint lithography.

Another prior art method is disclosed in U.S. Pat. No. 5,772,905 (the '905 Patent) by Stephen Y. Chou, which describes a lithographic method and apparatus for creating ultra-fine (sub-25 nm) patterns in a thin film coated on a substrate, in which a mold having at least one protruding feature is pressed into a thin film carried on a substrate. The protruding feature in the mold creates a recess of the thin film. First, the mold is removed from the film. The thin film is then processed such that the thin film in the recess is removed exposing the underlying substrate. Thus, the patterns in the mold are replaced in the thin film, completing the lithography. The patterns in the thin film will be, in subsequent processes, reproduced in the substrate or in another material, which is added onto the substrate.

The process of the '905 Patent involves the use of high pressures and high temperatures to emboss features on a material using micro molding. The use of high temperatures and pressures, however, is undesirable in imprint lithography since they result in unwanted stresses being placed on the device. For example, high temperatures cause variations in the expansion of the template and substrate. Since the template and substrate are often made of different materials, expansion creates serious layer-to-layer alignment problems. To avoid differences in expansion, the same material can be used but this limits material choices and increases overall costs of fabrication. Ideally, imprint lithography could be carried out at room temperatures and low pressures.

Moreover, the '905 Patent provides no details relative to the actual apparatus or equipment that would be used to achieve the process. In order to implement any imprint lithography process in a production setting, a carefully designed system must be utilized. Thus, a machine that can provide robust operation in a production setting is required. The '905 Patent does not teach, suggest or disclose such a system or machine.

Another issue relates to separation of the template from the substrate following imprinting. Typically, due to the nearly uniform contact area at the template-to-substrate interface, a large separation force is needed to pull the layers apart. Such force, however, could lead to shearing and/or destruction of the features imprinted on the substrate resulting in decreased yields.

In short, currently available orientation and overlay alignment methods are unsuitable for use with imprint lithography. A coupling between desirable orientation alignment and undesirable lateral motions can lead to repeated costly overlay alignment errors whenever orientation adjustments are required prior to printing of a field (a field could be for example a 1" by 1" region of an 8" wafer).

Further development of precise stages for robust implementation of imprint lithography is required for large-scale imprint lithography manufacturing. As such, a need exists for an improved imprint lithography process. A way of using imprint lithography as a fabrication technique without high pressures and high temperatures would provide numerous advantages.

SUMMARY OF THE INVENTION

An object of the present invention is to provide a process for imprint lithography for use in cost effective commercial fabrication of semiconductor devices and other various kinds of devices including patterned magnetic media for data storage, micro optical devices, MEMS, biological and chemical devices, and X-ray optical devices, etc.

Another object of the present invention is to provide a process for imprint lithography that avoids the use of high temperatures and high pressures.

Still another object of the present invention is to provide a way of precisely controlling the gap between a lithographed template and a substrate on which desired features from the template are to be transferred enabling a robust process for all imprint lithography techniques.

And still another object of the present invention is to provide a way of separating a template from a substrate following imprinting so that the imprinted features remain intact, the substrate remains stationary, and the separation forces are low.

And yet another object of the present invention is to provide a way of holding a substrate in place during imprint lithography.

These and other objects are achieved by the invention disclosed and claimed herein. The present invention provides processes and associated devices that can be used to achieve high-precision positioning of a template with respect to a substrate suitable for use in an imprint lithography process. The invention includes a pre-calibration stage that controls coarse orientation between the template and substrate without precise orientation alignment. An orientation stage provides fine orientation alignment of the template with respect to the substrate as well as precise control of the gap between the two. After imprinting, the template is removed from the substrate using a "peel-and-pull" method that ensures imprinted features are not sheared or destroyed. The peel-and-pull method of the invention is achieved without moving the substrate and without using large separation forces.

Accordingly, disclosed in one embodiment is a process for imprint lithography. The process comprises the steps of orienting a template and a substrate in spaced relation to each other so that a gap is created between them. Next, the gap is filled with a low viscosity liquid, which is cured to take on the shape of the gap. The template and substrate are separated so that a pattern is transferred from the template to the substrate leaving desired features on the substrate surface.

Preferably, the curing step is performed at room temperature and low pressures with the low viscosity liquid dispensed in such a way that no bubbles are formed within the gap. Orientation is performed so that the gap is approximately uniform across the template and substrate interface. For curing, the low viscosity liquid is exposed to UV light so that the features of the template are preserved in the liquid after hardening. Any silicon-based monomer or other UV curable organic material can be used for this purpose. Further, a transfer layer can be used between said UV curable material and the substrate to obtain high aspect ratio features.

According to the invention, separation of the template from the substrate is achieved without shearing any of the desired features from substrate surface. During separation, the template is "peeled" and "pulled" from the substrate in a way that prevents the features from being destroyed.

Also disclosed is a system capable of moving and aligning a template with respect to a substrate surface during imprint lithography. The system comprises a pre-calibration stage for course movement and alignment of a template with respect to a substrate so that a gap is created between the template and the surface of the substrate. An orientation stage is coupled to the pre-calibration stage and configured for fine movement and alignment of the template so that the gap is approximately uniform across the template and substrate interface.

The orientation stage comprises a first orientation sub-stage for moving and aligning the template about a first orientation axis and a second orientation sub-stage for moving and aligning the template about a second orientation axis. The first orientation sub-stage and second orientation sub-stage are coupled to each other so that the axes intersect at a point and the axes lie on the template-substrate interface.

The first orientation sub-stage further comprises a first flexure member having flexible joints for causing the first flexure member to rotate about the first orientation axis. Likewise, the second orientation-sub-stage further comprises a second flexure member coupled to the first flexure member and having flexible joints for causing the second flexure member to rotate about the second orientation axis. A support can be coupled to the second orientation sub-stage for securing the template during imprinting. The action of the flexure joints about the first and second orientation axes allows fine movement and alignment of the template with respect to the substrate so that a uniform gap is maintained between the template and substrate.

In one embodiment, four flexure joints are used and predisposed about the first orientation sub-stage to cause its motion about the first orientation axis. Likewise, four flexure joints are used and predisposed about the second orientation sub-stage to cause its motion about the second orientation axis. The flexure joints are configured in such a way so as to cause the first flexure member and second flexure member to pivot about a single point lying in a plane containing both the first orientation axis and second orientation axis.

Further disclosed is an orientation stage for achieving fine movement and alignment of a template with respect to a substrate during imprint lithography. The orientation stage comprises a first flexure member with first and second arms extending therefrom, each arm including a set of flexure joints which provide pivotal motion of the first flexure member about a first orientation axis. A second flexure member is provided having third and fourth arms extending therefrom, each arm including flexure joints, which provide pivotal motion of the second flexure member about a second orientation axis. A support is coupled to the second flexure member and adapted for holding a template in place during imprinting. The first and second flexure members are further adapted to be joined so that a template in the support moves about a point on the template intersected by the first and second orientation axes.

Preferably, the flexure joints of each flexure member are parallel to each other and constructed of a flexible material. In this regard, the arms can be shaped to include a first notch attached to a corresponding flexure member and a second notch for attachment to a fixed object with a rigid body section extending between the first and second notches.

For motion and alignment, the orientation stage can include actuators in operable contact with the flexure members to cause the support to pivot about a pivot point. The actuator can be of the piezo actuator type capable of being shortened and lengthened causing the flexure joints to rotate.

Also disclosed is a vacuum chuck for imprint lithography comprising a chuck body with a substantially flat upper surface having formations extending therefrom for contacting a substrate to be imprinted. A vacuum flow system is provided and extends through the chuck body to the upper surface for creating suction that holds the substrate in contact with the formations. The formations can be pins or grooves according to various embodiments. The vacuum chuck can be manufactured by drilling vacuum flow holes through an optical flat. Also, the upper surface of the optical flat can be lithographically patterned and subsequently etched into the optical flat to create a desired topography.

According to still another aspect of the invention, disclosed is a process for separating the template from a substrate to leave desired features substantially undamaged on the substrate following imprinting and to lead to low separation forces. The process comprises the steps of applying a first force to begin a peeling separation of the template from the substrate and applying a simultaneous second force to achieve a pulling separation of the template from the substrate. The first and second forces are applied to prevent shearing or destruction of desired features from the substrate and to reduce separation forces.

A technical advantage of the present invention is the achievement of imprint lithography without high temperatures or high pressures.

Another technical advantage of the present invention is that separation of the template from the substrate is achieved without shearing of imprinted features.

Still another technical advantage of the invention is reduced manufacturing cycles since course alignment of the template is achieved once for each batch of die.

BRIEF DESCRIPTION OF THE DRAWINGS

The above objects and advantages, as well as specific embodiments are better understood by reference to the following detailed description taken in conjunction with the appended drawings in which.

References in the figures correspond to those in the detailed description unless otherwise indicated.

DETAILED DESCRIPTION OF THE EMBODIMENTS

Without limiting the invention, it is herein described in connection with a system, devices, and related processes for imprinting very small features (sub-100-nanometer (nm) range) on a substrate, such as a semiconductor wafer, using methods of imprint lithography. It should be understood that the present invention can have application to other tasks such as, for example, the manufacture of cost-effective Micro-Electro-Mechanical Systems (or MEMS), as well as various kinds of devices including patterned magnetic media for data storage, micro optical devices, biological and chemical devices, X-ray optical devices, etc.

Figure 1A:
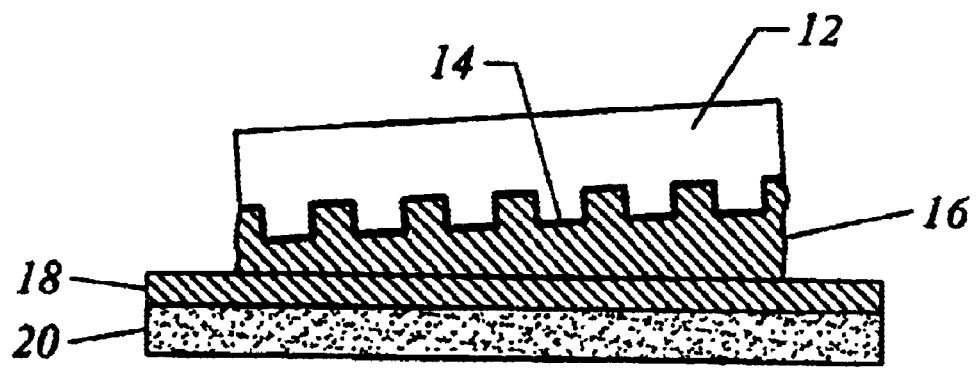
FIGS. 1A and 1B show undesirable gap between a template and a substrate.
Figure 1B:
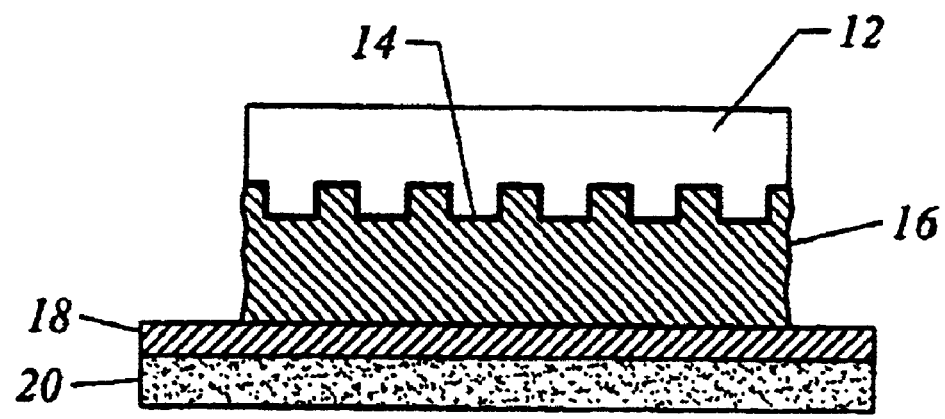

With reference now to the figures and specifically to FIGS. 1A and 1B, therein are shown arrangements of a template 12 predisposed with respect to a substrate 20 upon which desired features are to be imprinted using imprint lithography. Specifically, the template 12 includes a surface 14 that has been fabricated to take on the shape of desired features which, in turn, are transferred to the substrate 20. Between the substrate 20 and the template 12 lies a transfer layer 18, which receives the desired features from the template 12 via an imprinted layer 16. As is well known in the art, the transfer layer 18 allows one to obtain high aspect ratio structures (or features) from low aspect ratio imprinted features.

In FIG. 1A, a wedge shaped imprinted layer 16 results so that the template 12 is closer to the substrate 20 at one end of the imprinted layer 16. FIG. 1B shows the imprinted layer 16 being too thick. Both of these conditions are highly undesirable. The present invention provides a system, processes and related devices for eliminating the conditions illustrated in FIGS. 1A and 1B as well as other orientation problems associated with prior art lithography techniques.

Specifically, for the purpose of imprint lithography, it is necessary to maintain the template 12 and substrate 20 as close to each other as possible and nearly parallel. This requirement is very stringent as compared to other proximity lithography techniques such as proximity printing, contact printing, and X-ray lithography, as examples. Thus, for example, for features that are 100 nm wide and 100 nm deep, an average gap of about 200 nm or less with a variation of less than 50 nm across the imprinting area of the substrate 20 is required for the imprint lithography process to be successful. The present invention provides a way of controlling the spacing between the template 12 and substrate 20 for successful imprint lithography given such tight and precise gap requirements.

Figure 2A:
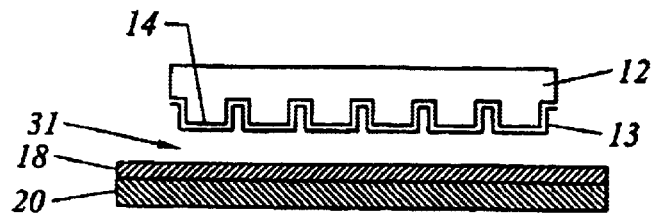
FIGS. 2A thru 2E illustrate a version of the imprint lithography process according to the invention.
Figure 2B:
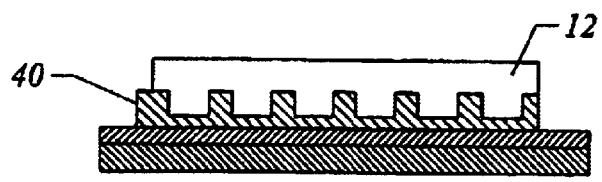

FIGS. 2A thru 2E illustrate the process, denoted generally as 30, of imprint lithography according to the invention. In FIG. 2A, the template 12 is orientated in spaced relation to the substrate 20 so that a gap 31 is formed in the space separating the template 12 and substrate 20. The surface 14 of template 12 is treated with a thin layer 13 that lowers the template surface energy and assists in separation of the template 12 from the substrate 20. The manner of orientation including devices for controlling of the gap 31 between the template 12 and substrate 20 are discussed below. Next, in FIG. 2B, the gap 31 is filled with a substance 40 that conforms to the shape of the treated surface 14. Essentially, the substance 40 forms the imprinted layer 16 shown in FIGS. 1A and 1B. Preferably, the substance 40 is a liquid so that it fills the space of gap 31 rather easily without the use of high temperatures and the gap 31 can be closed without requiring high pressures.

Figure 2C:
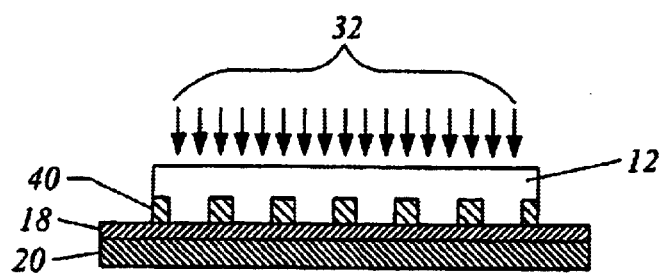

A curing agent 32, shown in FIG. 2C, is applied to the template 12 causing the substance 40 to harden and assume the shape of the space defined by gap 31 between the template 12 and substrate 20. In this way, desired features 44, shown in FIG. 2D, from the template 12 are transferred to the upper surface of the substrate 20. A transfer layer 18 is provided directly on the upper surface of the substrate 20 which facilitates the amplification of features transferred from the template 12 onto the substrate 20 to generate high aspect ratio features.

Figure 2D:
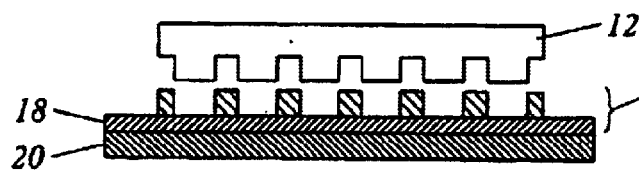

In FIG. 2D, the template 12 is removed from the substrate 20 leaving the desired features 44 thereon. The separation of the template 12 from the substrate 20 must be done so that desired features 44 remain intact without shearing or tearing from the surface of the substrate 20. The present invention provides a method and associated system for peeling and pulling (referred to herein as the "peel-and-pull" method) the template 12 from the substrate 20 following imprinting so the desired features 44 remain intact.

Figure 2E:
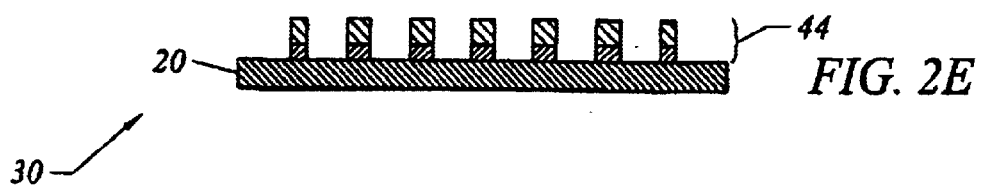
Figure 3:
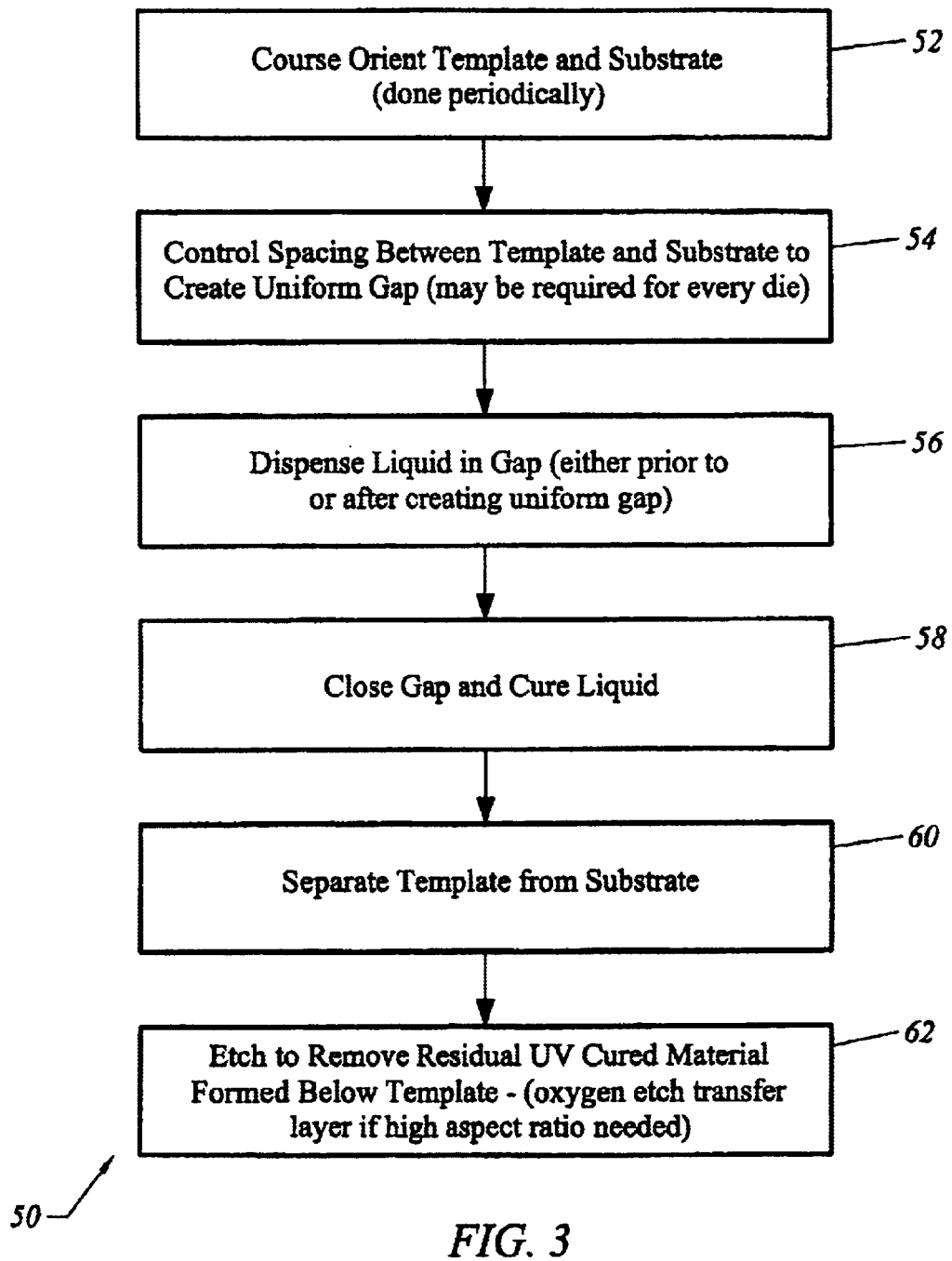
FIG. 3 is a process flow diagram showing the sequence of steps of the imprint lithography process of FIGS. 2A thru 2E.

Finally, in FIG. 2E, the features 44 transferred from the template 12, shown in FIG. 2D, to the substrate 20 are amplified in vertical size by the action of the transfer layer 18, as is known in the use of bi-layer resist processes. The resulting structure can be further processed to complete the manufacturing process using well-known techniques. FIG. 3 summarizes the imprint lithography process, denoted generally as 50, of the present invention in flow chart form. Initially, at step 52, course orientation of a template and a substrate is performed so that a rough alignment of the template and substrate is achieved. The advantage of course orientation at step 52 is that it allows pre-calibration in a manufacturing environment where numerous devices are to be manufactured with efficiency and with high production yields. For example, where the substrate comprises one of many die on a semiconductor wafer, course alignment (step 52) can be performed once on the first die and applied to all other dies during a single production run. In this way, production cycle times are reduced and yields are increased.

Next, at step 54, the spacing between the template and substrate is controlled so that a relatively uniform gap is created between the two layers permitting the type of precise orientation required for successful imprinting. The present invention provides a device and system for achieving the type of orientation (both course and fine) required at step 54. At step 56, a liquid is dispensed into the gap between the template and substrate. Preferably, the liquid is a UV curable organosilicon solution or other organic liquids that become a solid when exposed to UV light. The fact that a liquid is used eliminates the need for high temperatures and high pressures associated with prior art lithography techniques.

At step 58, the gap is closed with fine orientation of the template about the substrate and the liquid is cured resulting in a hardening of the liquid into a form having the features of the template. Next, the template is separated from the substrate, step 60, resulting in features from the template being imprinted or transferred onto the substrate. Finally, the structure is etched, step 62, using a preliminary etch to remove residual material and a well-known oxygen etching technique to etch the transfer layer.

As discussed above, requirements for successful imprint lithography include precise alignment and orientation of the template with respect to the substrate to control the gap in between the template and substrate. The present invention provides a system capable of achieving precise alignment and gap control in a production style fabrication process. Essentially, the system of the present invention provides a pre-calibration stage for performing a preliminary and course alignment operation between the template and substrate surface to bring the relative alignment to within the motion range of a fine movement orientation stage. This pre-calibration stage is required only when a new template is installed into the machine (also sometimes known as a stepper) and consists of a base plate, a flexure component, and three micrometers or high resolution actuators that interconnect the base plate and the flexure component.

Figure 4:
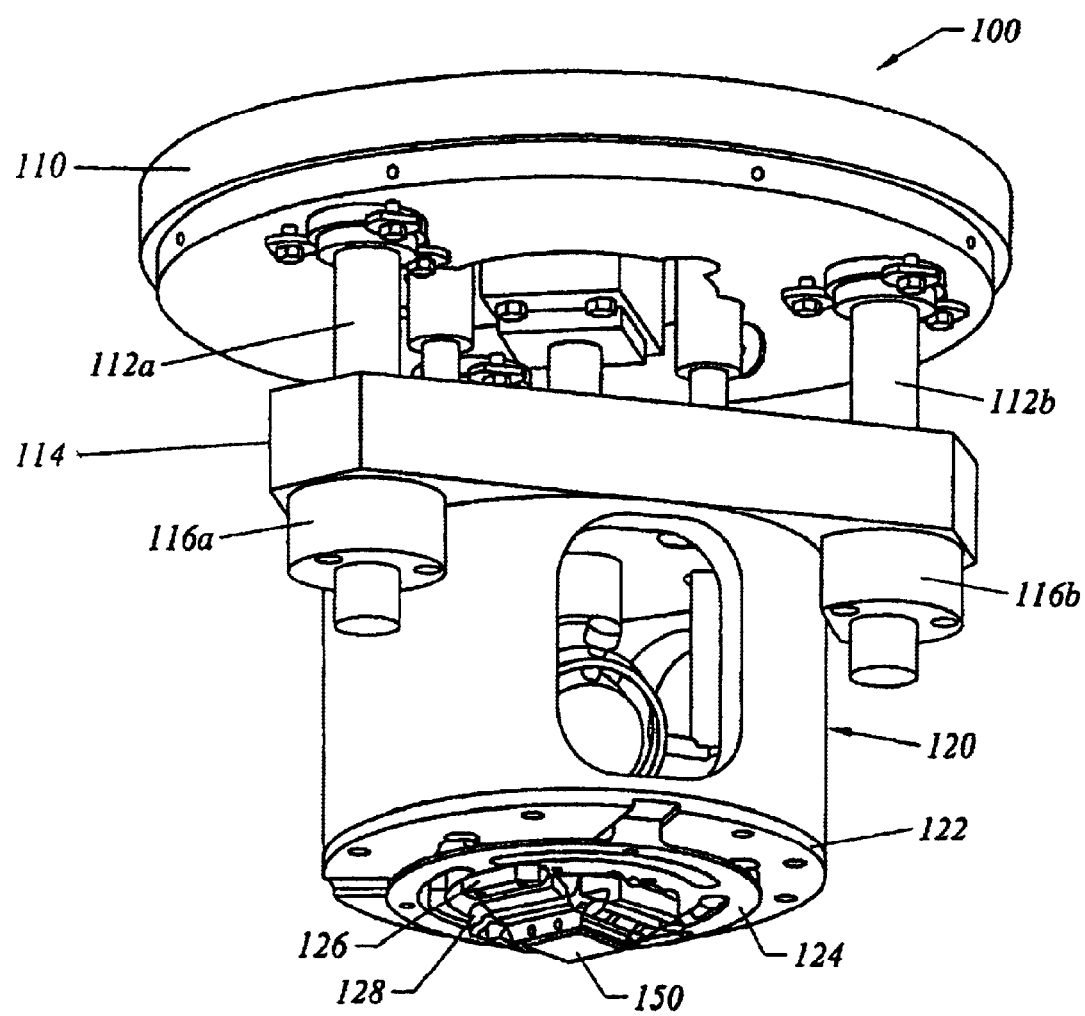
FIG. 4 shows an assembly of an orientation alignment and gap control system including both a course calibration stage and a fine orientation alignment and gap control stage according to one embodiment of the invention.

With reference to FIG. 4, therein is shown an assembly of the system, denoted generally as 100, for calibrating and orienting a template, such as template 12, shown in FIG. 1A, about a substrate to be imprinted, such as substrate 20. The system 100 can be utilized in a machine, such as a stepper, for mass fabrication of devices in a production type environment using the imprint lithography processes of the present invention. As shown, the system 100 is mounted to a top frame 110 which provides support for a housing 120 which contains the pre-calibration stage for course alignment of a template 150 about a substrate (not shown in FIG. 4).

The housing 120 is seen coupled to a middle frame 114 with guide shafts 112a and 112b attached to the middle frame 114 opposite the housing 120. In one embodiment, three (3) guide shafts are used (the back guide shaft is not visible in FIG. 4) to provide a support for the housing 120 as it slides up and down during vertical translation of the template 150. This up-and-down motion of the housing 120 is facilitated by sliders 116a and 116b which attach to corresponding guide shafts 112a and 112b about the middle frame 114.

Figure 5:
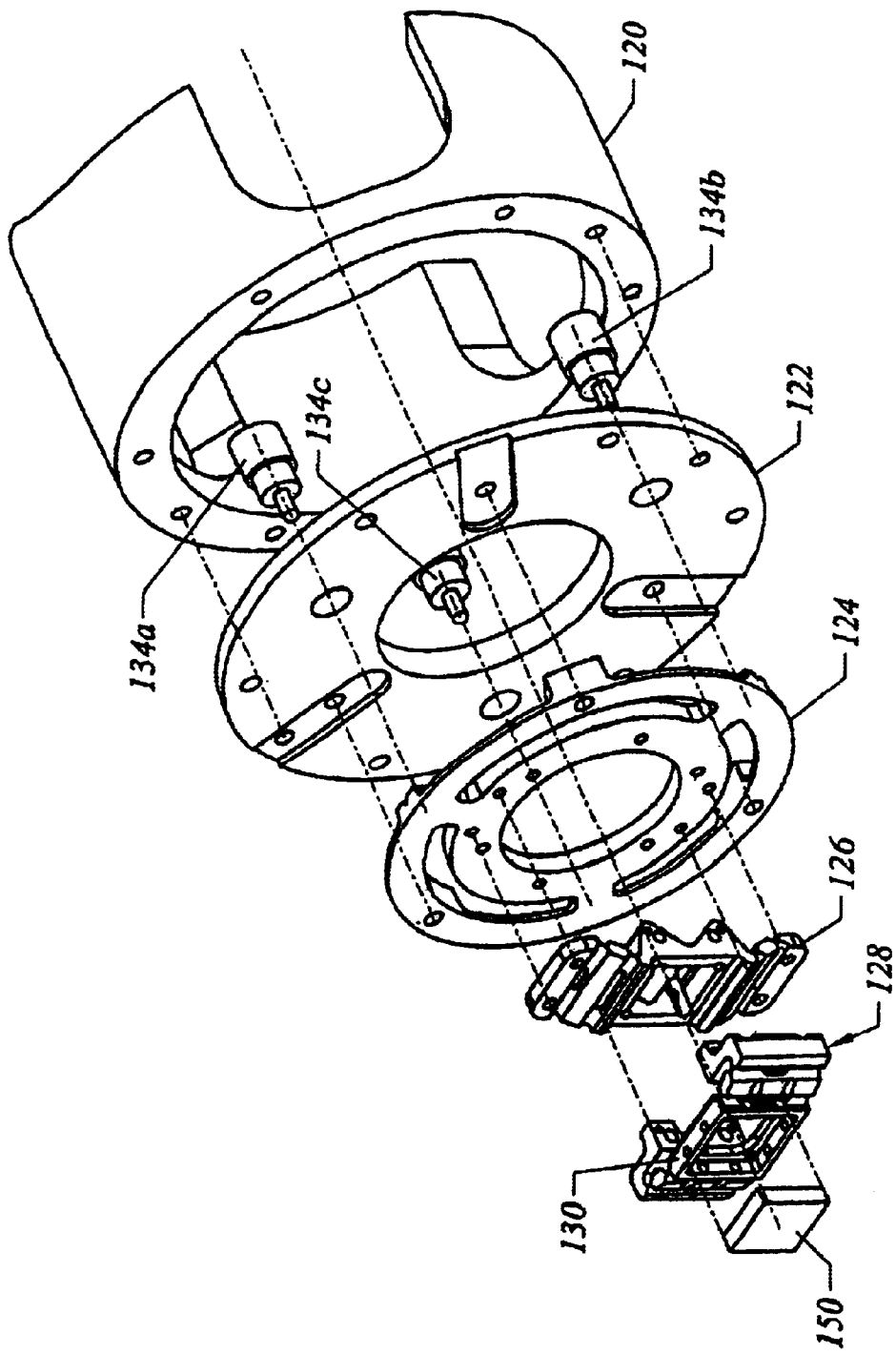
FIG. 5 is an exploded view of the system of FIG. 4.

System 100 includes a disk-shaped base plate 122 attached to the bottom portion of the housing 120 which, in turn, is coupled to a disk-shaped flexure ring 124 for supporting the lower placed orientation stage comprised of first flexure member 126 and second flexure member 128. The operation and configuration of the flexure members 126 and 128 are discussed in detail below. In FIG. 5, the second flexure member 128 is seen to include a template support 130, which holds the template 150 in place during the imprinting process. Typically, the template 150 comprises a piece of quartz with desired features imprinted on it, although other template substances may be used according to well-known methods.

As shown in FIG. 5, three (3) actuators 134a, 134b and 134c are fixed within the housing 120 and operable coupled to the base plate 122 and flexure ring 124. In operation, the actuators 134a, 134b and 134c would be controlled such that motion of the flexure ring 124 is achieved. This allows for coarse pre-calibration. The actuators 134a, 134b and 134c can also be high resolution actuators which are equally spaced apart about the housing 120 permitting the additional functionality of very precise translation of the flexure ring 124 in the vertical direction to control the gap accurately. In this way, the system 100, shown in FIG. 4, is capable of achieving coarse orientation alignment and precise gap control of the template 150 with respect to a substrate to be imprinted.

The system 100 of the present invention provides a mechanism that enables precise control of the template 150 so that precise orientation alignment is achieved and a uniform gap is maintained by the template with respect to a substrate surface. Additionally, the system 100 provides a way of separating the template 150 from the surface of the substrate following imprinting without shearing of features from the substrate surface. The precise alignment, gap control and separation features of the present invention are facilitated mainly by the configuration of the first and second flexure members, 126 and 128, respectively.

Figure 6A:
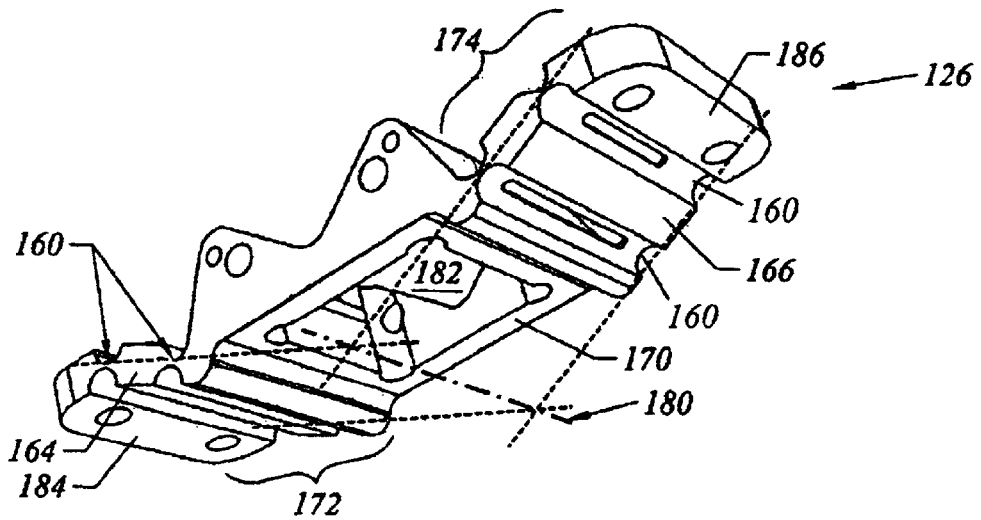
FIGS. 6A and 6B show first and second orientation sub-stages, respectively, in the form of first and second flexure members with flexure joints according to one embodiment of the invention.
Figure 6B:
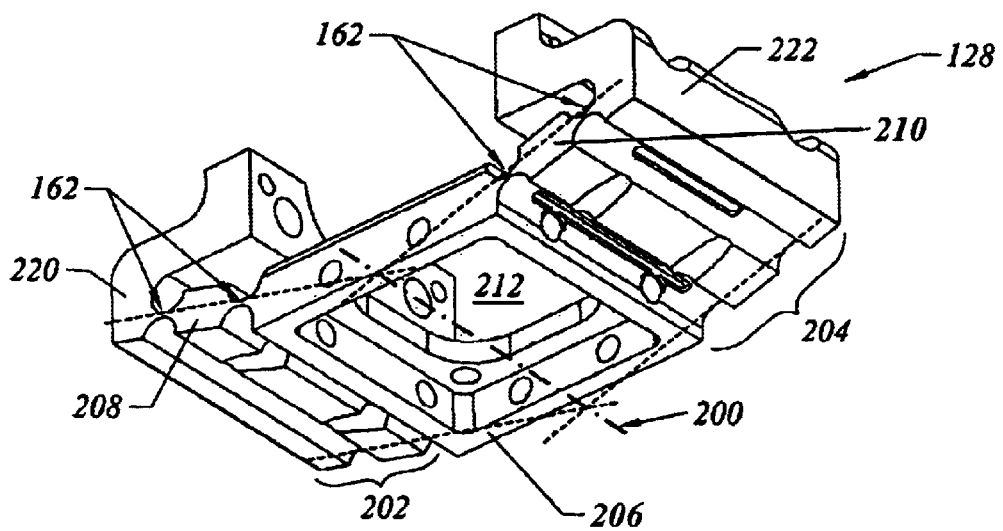

With reference to FIGS. 6A and 6B, therein are shown the first and second flexure members, 126 and 128, respectively, in more detail. Specifically, the first flexure member 126 is seen to include a plurality of flexure joints 160 coupled to corresponding rigid bodies 164, 166 which form part of arms 172, 174 extending from a frame 170. The flexure frame 170 has an opening 182, which permits the penetration of a curing agent, such as UV light, to reach the template 150 when held in support 130. As shown, four (4) flexure joints 160 provide motion of the flexure member 126 about a first orientation axis 180. The frame 170 of first flexure member 126 provides a coupling mechanism for joining with the second flexure member 128 as illustrated in FIG. 7.

Likewise, the second flexure member 128 include a pair of arms 202, 204 extending from a frame 206 and including flexure joints 162 and corresponding rigid bodies 208, 210 which are adapted to cause motion of the flexure member 128 about a second orientation axis 200. The template support 130 is integrated with the frame 206 of the second flexure member 128 and, like frame 170, has an opening 212 permitting a curing agent to reach a template 150 held by support 130.

Figure 7:
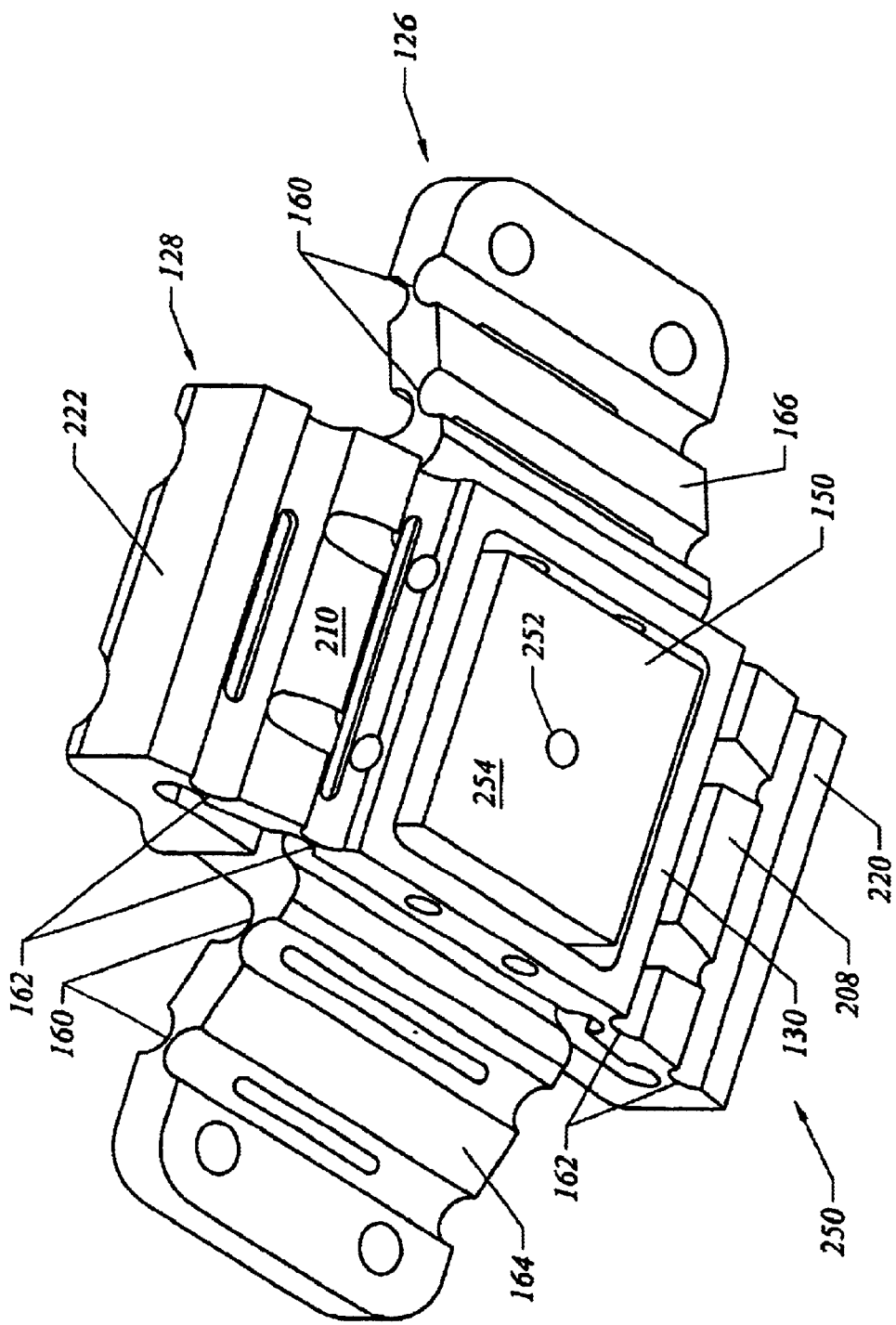
FIG. 7 shows the assembled fine orientation stage with first and second flexure members coupled to each other so that their orientation axes converge on a single pivot point.

In operation, the first flexure member 126 and second flexure member 128 are joined, as shown in FIG. 7, to form the orientation stage 250 of the present invention. Braces 220 and 222 are provided in order to facilitate joining of the two pieces such that the first orientation axis 180, shown in FIG. 6A, and second orientation axis 200, shown in FIG. 6B, are orthogonal to each other and intersect at a pivot point 252 at the template-substrate interface 254. The fact that first orientation axis 180 and second orientation axis 200 are orthogonal and lie on interface 254 provide the fine alignment and gap control advantages of the invention. Specifically, with this arrangement, a decoupling of orientation alignment from layer-to-layer overlay alignment is achieved. Furthermore, as explained below, the relative position of the first orientation axis 180 and second orientation axis 200 provides an orientation stage 250 that can be used to separate the template 150 from a substrate without shearing of desired features so that features transferred from the template 150 remain intact on the substrate.

Referring to FIGS. 6A, 6B and 7, the flexure joints 160 and 162 are notched shaped to provide motion of the rigid bodies 164, 166, 208 and 210 about pivot axes that are located along the thinnest cross section of the notches. This configuration provides two (2) flexure-based sub-systems for a fine decoupled orientation stage 250 having decoupled compliant orientation axes. 180 and 200. The two flexure members 126 and 128 are assembled via mating of surfaces such that motion of the template 150 occurs about the pivot point 252 eliminating "swinging" and other motions that would destroy or shear imprinted features from the substrate. Thus, the fact that the orientation stage 250 can precisely move the template 150 about a pivot point 252 eliminates shearing of desired features from a substrate following imprint lithography.

A system, like system 100, shown in FIG. 4, based on the concept of the flexure components has been developed for the imprinting process described above in connection with FIGS. 2A thru 2E. One of many potential application areas is the gap control and overlay alignment required in high-resolution semiconductor manufacturing. Another application may be in the area of single layer imprint lithography for next generation hard disk manufacturing. Several companies are considering such an approach to generate sub-100 nm dots on circular magnetic media. Accordingly, the invention is potentially useful in cost effective commercial fabrication of semiconductor devices and other various kinds of devices including patterned magnetic media for data storage, micro optical devices, MEMS, biological and chemical devices, X-ray optical devices, etc.

Figure 8:
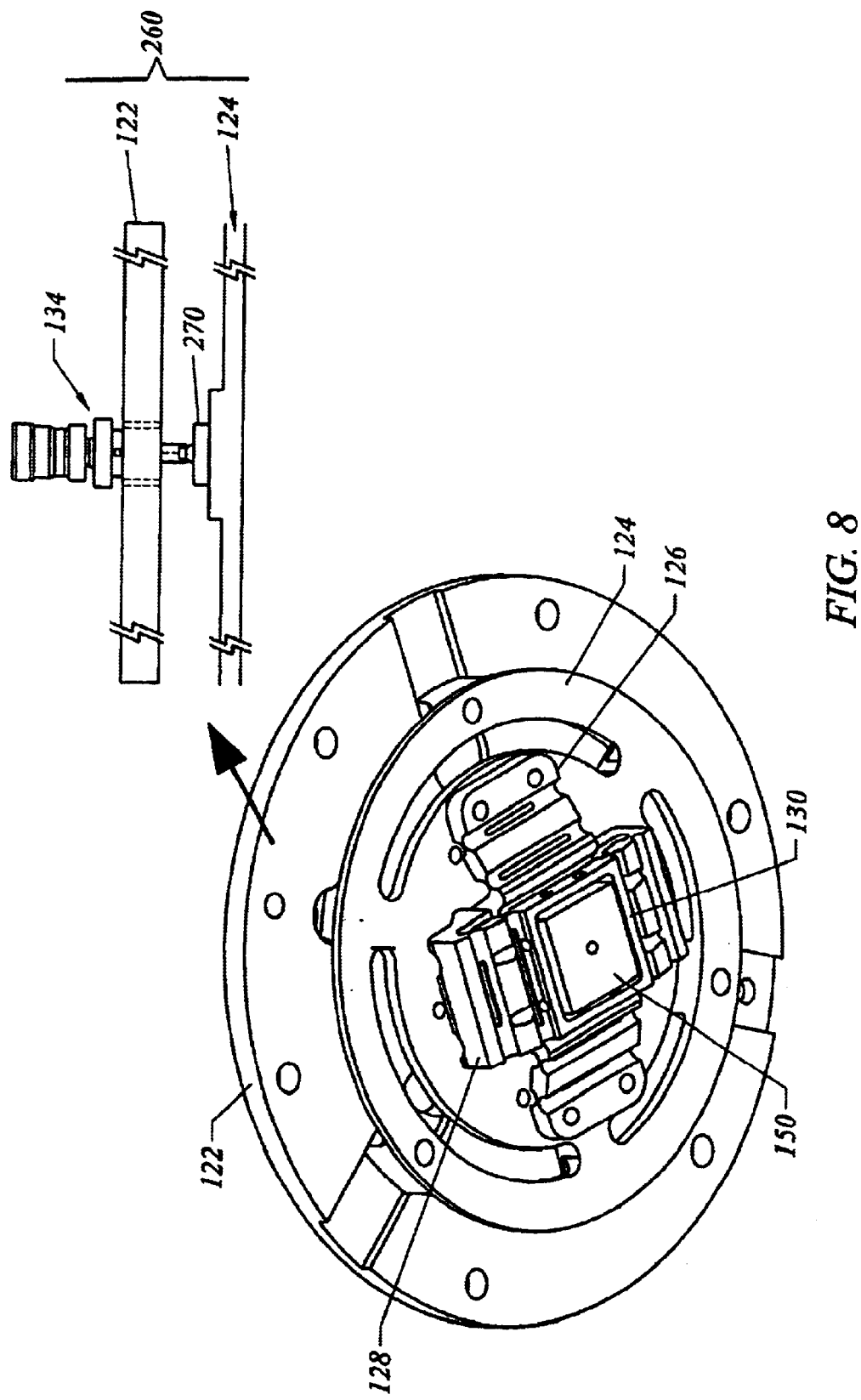
FIG. 8 is an assembly view of the course calibration stage (or pre-calibration stage) coupled to the fine orientation stage according to one embodiment.

Referring to FIG. 8, during operation of the system 100, shown in FIG. 4, a Z-translation stage (not shown) controls the distance between the template 150 and substrate without providing orientation alignment. A pre-calibration stage 260 performs a preliminary alignment operation between the template 150 and wafer surfaces to bring the relative alignment to within the motion range limits of the orientation stage 250, shown in FIG. 7. Pre-calibration is required only when a new template is installed into the machine.

The pre-calibration stage 260 is made of a base plate 122, a flexure ring 124, and actuators 134a, 134b and 134c (collectively 134) that interconnect the base plate 122 and the flexure ring 124 via load cells 270 that measure the imprinting and separation forces in Z-direction. The actuators 134a, 134b and 134c can be three differential micrometers capable of expanding and contracting to cause motion of the base plate 122 and the flexure ring 124. Alternatively, the actuators 134 can be a combination of micrometer and piezo or tip-type piezo actuators such as those offered by Physik Instruments, Inc.

Pre-calibration of a template 150 with respect to a substrate can be performed by adjusting the actuators 134 while visually inspecting the monochromatic light induced fringe pattern appearing at the interface of the template lower surface and the substrate top surface. Using differential micrometers, it has been demonstrated that two flat surfaces can be oriented parallel within 200 nm error across 1 inch using fringes obtained from green light.

Figure 9:
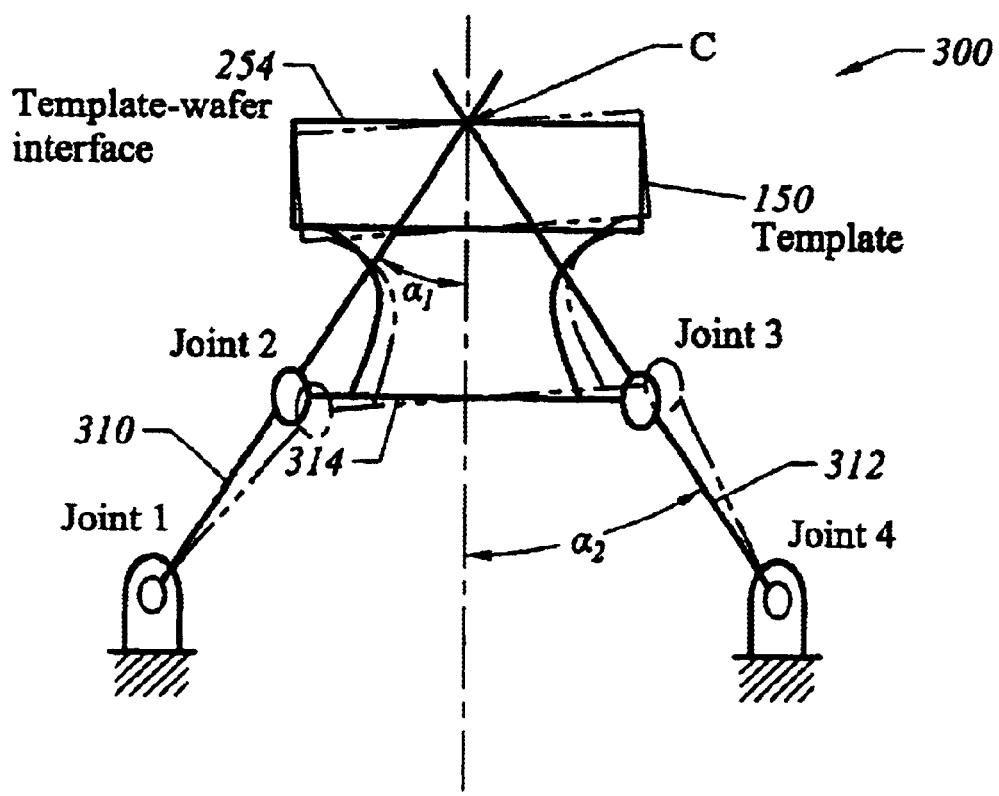
FIG. 9 is a simplified diagram of a 4-bar linkage illustrating the motion of flexure joints that result in an orientation axis.

With reference to FIG. 9, therein is shown a flexure model, denoted generally as 300, useful in understanding the principles of operation for a fine decoupled orientation stage, such as orientation stage 250 of FIG. 7. The flexure model 300 includes four (4) parallel joints—Joints 1, 2, 3 and 4—that provide a four-bar-linkage system in its nominal and rotated configurations. The angles ($_1$ and $_2$) between the line 310 passing through Joints 1 and 2 and the line 312 passing thru Joints 3 and 4, respectively, are selected so that the compliant alignment axis lies exactly on the template-wafer interface 254 within high precision machining tolerances (a few microns). For fine orientation changes, the rigid body 314 between Joints 2 and 3 rotates about an axis that is depicted by Point C. The rigid body 314 is representative of rigid bodies 164 and 208 of the flexure members 126 and 128, shown in FIGS. 6A and 6B, respectively.

Since a similar second flexure component is mounted orthogonally onto the first one, as shown in FIG. 7, the resulting orientation stage 250 has two decoupled orientation axes that are orthogonal to each other and lie on the template-substrate interface 254. The flexure components can be readily adapted to have openings so that a curing UV light can pass through the template 150 as required in lithographic applications.

The orientation stage 250 is capable of fine alignment and precise motion of the template 150 with respect to a substrate and, as such, is one of the key components of the present invention. The orientation adjustment, which the orientation stage 250 provides ideally, leads to negligible lateral motion at the interface and negligible twisting motion about the normal to the interface surface due to selectively constrained high structural stiffness. The second key component of the invention is the flexure-based members 126 and 128 with flexure joints 160 and 162 which provide for no particle generation and which can be critical for the success of imprint lithography processes.

This invention assumes the availability of the absolute gap sensing approach that can measure small gaps of the order of 200 nm or less between the template 150 and substrate with a resolution of a few nanometers. Such gap, sensing is required as feedback if gap control is to actively by use of actuators.

Figure 10:
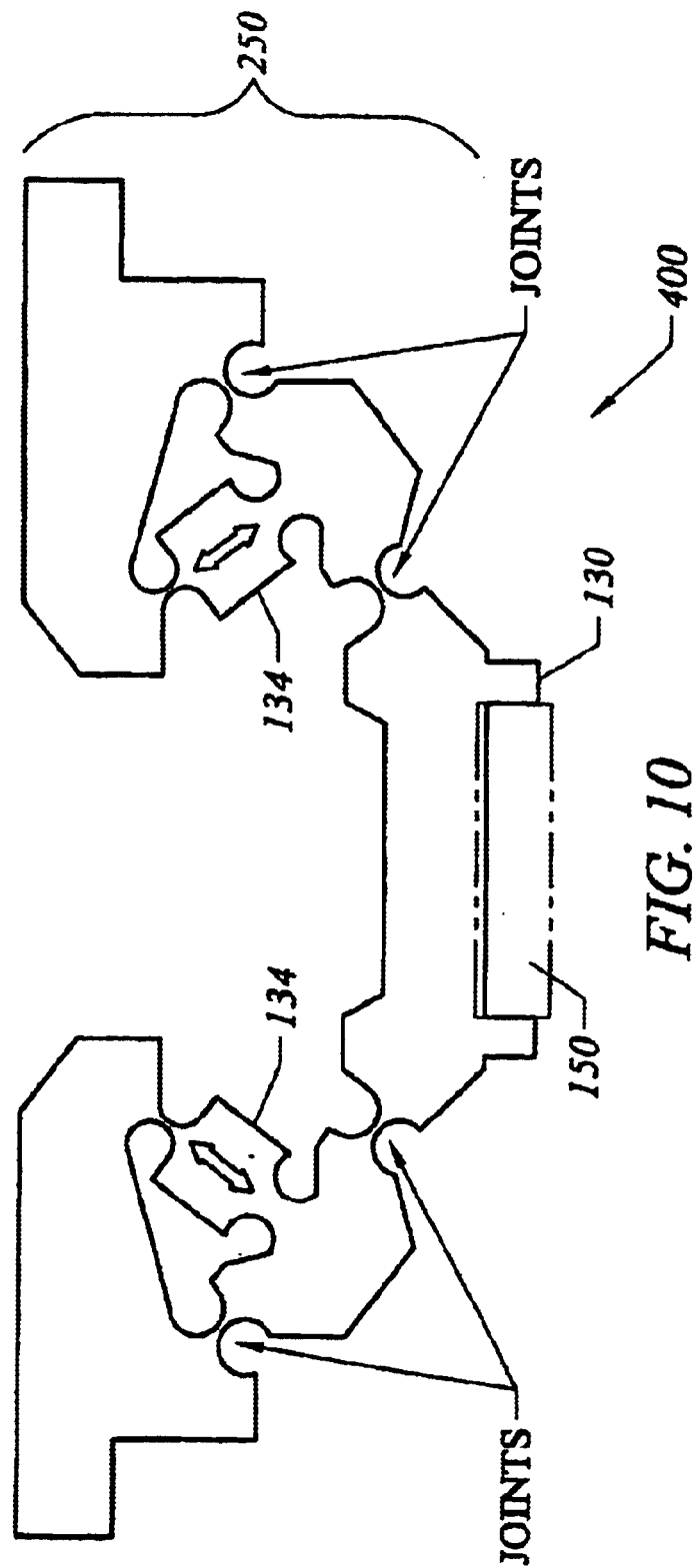
FIG. 10 illustrates a side view of the assembled orientation stage with piezo actuators.

FIG. 10 shows a configuration of the orientation stage 250 with piezo actuators, denoted generally as 400. The configuration 400 generates pure tilting motions with no lateral motions at template-substrate interface 254, shown in FIG. 7. Therefore, a single overlay alignment step will allow the imprinting of a layer on the entire wafer. For overlay alignment, coupled motions between the orientation and lateral motions lead to inevitable disturbances in X-Y alignment, which requires a complicated field-to-field overlay control loop.

Preferably, the orientation stage 250 possesses high stiffness in the directions where side motions or rotations are undesirable, and lower stiffness in directions where necessary orientation motions are desirable, which leads to a selectively compliant device. Therefore, the orientation stage 250 can support relatively high loads while achieving proper orientation kinematics between template 150 and the substrate.

Figure 12:
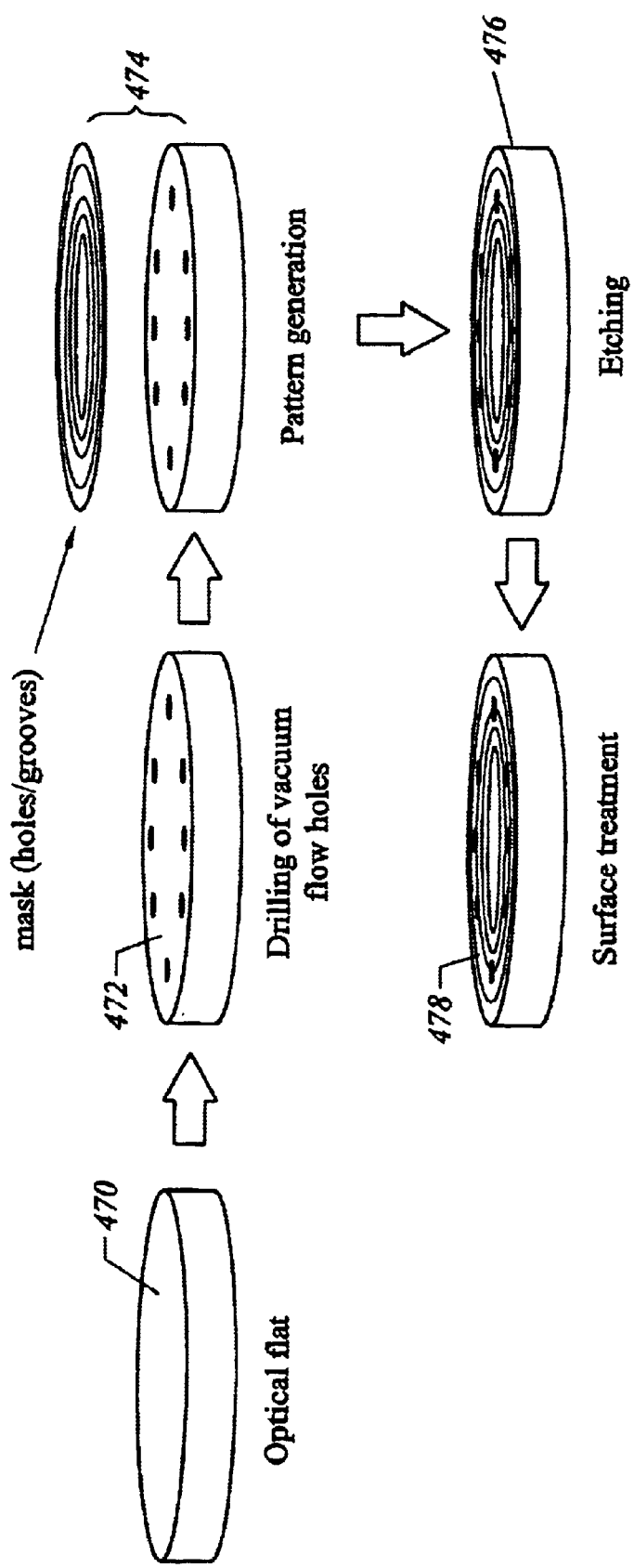
FIG. 12 illustrates the method for manufacturing a vacuum chuck of the types illustrated in FIGS. 11A and 11B.

With imprint lithography, a requirement exists that the gap between two extremely flat surfaces be kept uniform. Typically, the template 150 is made from optical flat glass using electron beam lithography to ensure that it is substantially flat on the bottom. The wafer substrate, however, can exhibit a "potato chip" effect resulting in small micron-scale variations on its topography. The present invention provides a device, in the form of a vacuum chuck 478 (as shown in FIG. 12), to eliminate variations across a surface of the wafer substrate that can occur during imprinting.

Figure 11A:
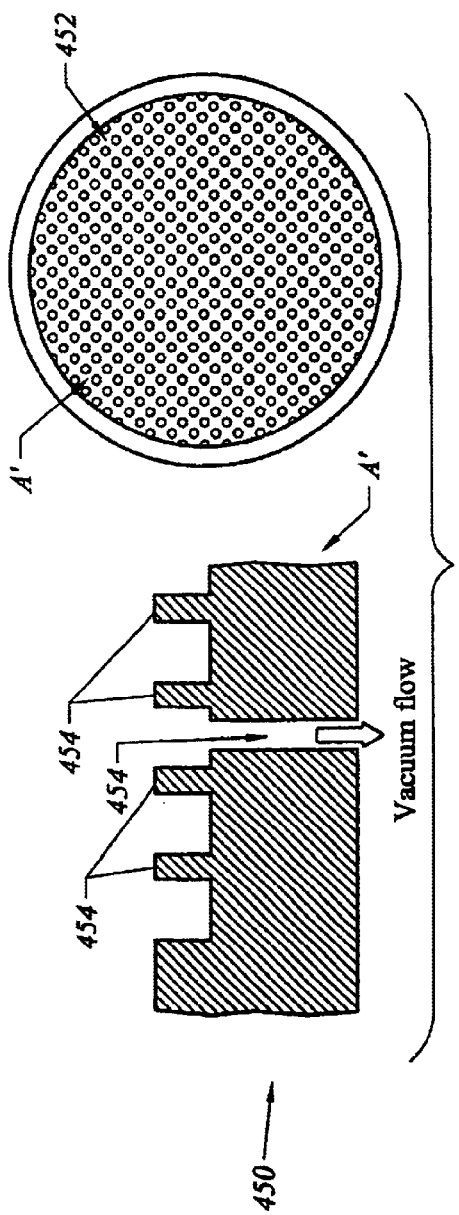
FIGS. 11A and 11B illustrate configurations for a vacuum chuck according to the invention.
Figure 11B:
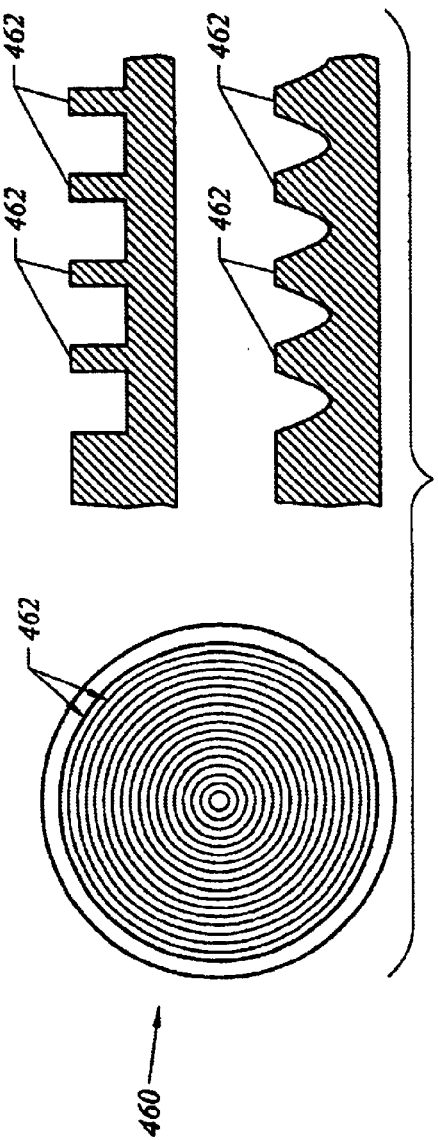

Vacuum chuck 478 serves two primary purposes. First, vacuum chuck 478 is utilized to hold the substrate in place during imprinting and to ensure that the substrate stays flat during the imprinting process. Additionally, vacuum chuck 478 ensures that no particles are present on the back of the substrate during processing. This is important to imprint lithography as particles can create problems that ruin the device and decrease production yields. FIGS. 11A and 11B illustrate variations of a vacuum chuck suitable for these purposes according to two embodiments.

In FIG. 11A, a pin-type vacuum chuck 450 is shown as having a large number of pins 452 that eliminates "potato chip" effect as well as other deflections on the substrate during processing. A vacuum channel 454 is provided as a means of pulling on the substrate to keep it in place. The spacing between the pins 452 is maintained so the substrate will not bow substantially from the force applied through the vacuum channel 454. At the same time, the tip of the pins 452 are small enough to reduce the chance of particles settling on top of it.

Thus, with a pin-type vacuum chuck 450, a large number of pins 452 are used to avoid local bowing of the substrate. At the same time, the pin heads should be very small since the likelihood of the particle falling in between the gaps between the pins 452 can be high avoiding undesirable changing the shape of the substrate itself.

FIG. 11B shows a groove-type vacuum chuck 460 with grooves 462 across its surface. The multiple grooves 462 perform a similar function to the pins 454 of the pin-type vacuum chuck 450. As shown, grooves 462 can take on either a wall shape 464 or have a smooth curved cross section 466. The cross section of the grooves 462 for the groove-type vacuum chuck 460 can be adjusted through an etching process. Also, the space and size of each groove can be as small as hundreds of microns. Vacuum flow to each of the grooves 462 can be provided through fine vacuum channels across multiple grooves that run in parallel with respect to the chuck surface. The fine vacuum channels can be made along with grooves through an etching process.

FIG. 12 illustrates the manufacturing process for both of the pin-type vacuum chuck 450, shown in FIG. 11A, and the groove-type vacuum chuck 460, shown in FIG. 11B. Using optical flats 470, no additional grinding and polishing steps are necessary for this process. Drilling at specified places of the optical flat 470 produces vacuum flow holes 472 which are then masked and patterned 474 before etching 476 to produce the desired feature—either pins or grooves—on the upper surface of the optical flat 470. The surface can then be treated 479 using well-known methods.

Figure 13A:
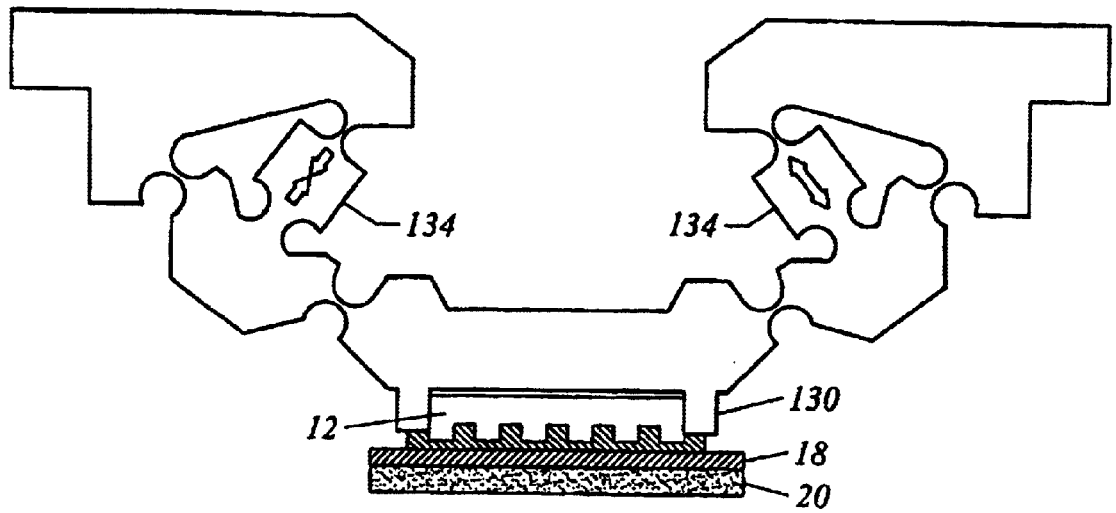
FIGS. 13A, 13B and 13C illustrate use of the fine orientation stage to separate a template from a substrate using the "peel-and-pull" method of the present invention.
Figure 13B:
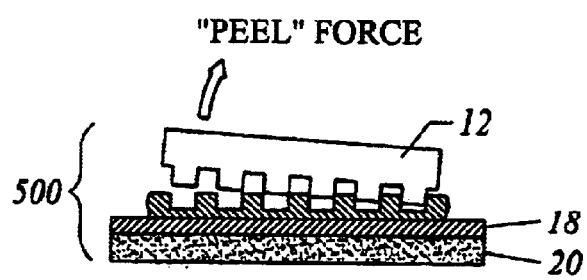
Figure 13C:
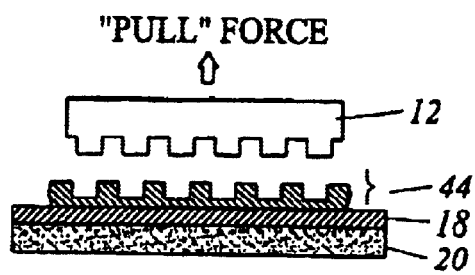

As discussed above, separation of the template 150 from the imprinted layer is a critical and important final step of imprint lithography. Since the template 150 and substrate are almost perfectly oriented, the assembly of the template 150, imprinted layer, and substrate leads to a uniform contact between near optical flats, which usually requires a large separation force. In the case of a flexible template or substrate, the separation can be merely a "peeling process". However, a flexible template or substrate is undesirable from the point of view of high-resolution overlay alignment. In case of quartz template and silicon substrate, the peeling process cannot be implemented easily. The separation of the template from an imprinted layer can be performed successfully either by one of the two following schemes or the combination of them as illustrated by FIGS. 13A, 13B and 13C.

For clarity, reference numerals 12, 18, and 20 will be used in referring to the template, transfer layer and substrate, respectively, in accordance with FIGS. 1A and 1B. After UV curing of the substrate 20, either the template 12 or substrate 20 can be tilted intentionally to induce a wedge 500 between the template 12 and transfer layer 18 on which the imprinted layer resides. The orientation stage 250 of the present invention can be used for this purpose while the substrate 20 is held in place by vacuum chuck 478. The relative lateral motion between the template 12 and substrate 20 can be insignificant during the tilting motion if the tilting axis is located close to the template-substrate interface. Once the wedge 500 between template 12 and substrate 20 is large enough, the template 12 can be separated from the substrate 20 completely using Z-motion. This "peel and pull" method results in the desired features 44 being left intact on the transfer layer 18 and substrate 20 without undesirable shearing.

Figure 14A:
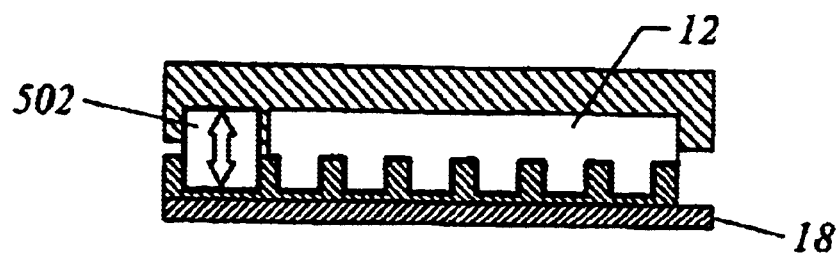
FIGS. 14A, 14B, and 14C illustrate an alternative method of separating a template from a substrate using a piezo actuator.
Figure 14B:
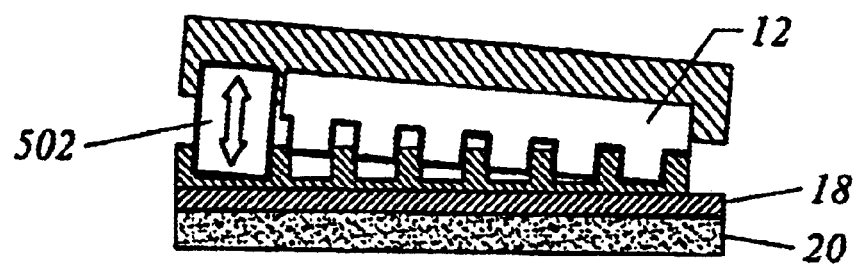
Figure 14C:
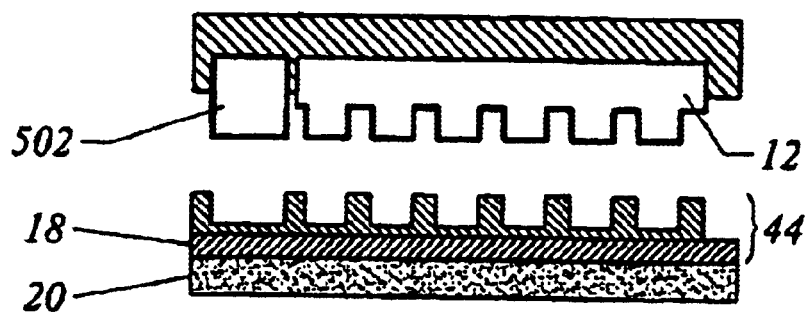

An alternative method of separating the template 12 from the substrate 20 without destroying desired features 44 is illustrated by FIGS. 14A, 148 and 14C. One or more piezo actuator(s) 502 are installed adjacent to the template 12, and a relative tilt can be induced between the template 12 and substrate 20 (FIG. 14A). The free end of the piezo actuator 502 is in contact with the substrate 20 so that when the actuator 502 is enlarged (FIG. 14B), the template 12 can be pushed away from the substrate 20. Combined with a Z-motion between the template 12 and substrate 20 (FIG. 14C), such a local deformation can induce a "peeling" and "pulling" effect between the template 12 and substrate 20. The free end side of the piezo actuator 502 can be surface treated similar to the treatment of the lower surface of the template 12 in order to prevent the imprinted layer from sticking to the surface of the piezo actuator 502.

In summary, the present invention discloses a system, processes and related devices for successful imprint lithography without requiring the use of high temperatures or high pressures. With the present invention, precise control of the gap between a template and a substrate on which desired features from the template are to be transferred is achieved. Moreover, separation of the template from the substrate (and the imprinted layer) is possible without destruction or shearing of desired features. The invention also discloses a way, in the form of suitable vacuum chucks, of holding a substrate in place during imprint lithography.

While this invention has been described with a reference to illustrative embodiments, the description is not intended to be construed in a limiting sense. Various modifications and combinations of the illustrative embodiments as well as other embodiments of the invention, will be apparent to persons skilled in the art upon reference to the description. It is, therefore, intended that the appended claims encompass any such modifications or embodiments.

What is claimed is:

1. A method of separating a template extending in a first plane from a substrate extending in a second plane, said method comprising:
    applying a first force to form an oblique angle between said first plane and said second plane; and
    applying a second force differing from said first force to increase a distance between said template and said substrate so that said template is spaced-apart from said substrate, with said first force and said second force being greater than zero.

2. The method as recited in claim 1 wherein applying said first force further includes causing said template to be tilted with respect to said substrate, with said substrate remaining stationary.

3. The method as recited in claim 1 wherein applying said first force further includes causing said template to be tilted with respect to said substrate, with said template remains remaining stationary.

4. The method as recited in claim 1 wherein applying said second force further includes applying said second force by a flexure system.

5. The method as recited in claim 1 wherein applying said second force further includes applying said second force by a piezo actuator, with said piezo actuator containing a first end and a second end positioned opposite to each other, said first end being attached to said template and said second end being in contact with said substrate, with enlarging said piezo actuator causing said template to be pushed away from said substrate.

6. The method as recited in claim 5 wherein applying said second force further includes having said second end treated with a low surface energy layer.

7. A method of separating a template from a substrate, with a first distance and a second distance defined therebetween, with said first distance being defined opposite to said second distance, said method comprising:
    applying a first force to increase a first spacing between said substrate and said template so that a rate of change of said first distance is at a higher rate than a rate of change of said second distance; and
    applying a second force differing from said first force to increase a second spacing between said substrate and said template so that a rate of change of said first distance and said second distance are substantially uniform, with said first force and said second force being greater than zero.

8. The method as recited in claim 7 wherein applying said first force further includes forming a wedge between said template and said substrate at one end of a template substrate interface, with said template being tilted with respect to said substrate and said substrate remaining stationary.

9. The method as recited in claim 7 wherein applying said first force further includes forming a wedge between said template and said substrate at one end of a template-substrate interface, with said substrate being tilted with respect to said template and said template remaining stationary.

10. The method as recited in claim 7 wherein applying said second force further includes causing said template to be substantially separated from said substrate.

11. The method as recited in claim 7 wherein applying said second force further includes applying said second force by a flexure system.

12. The method as recited in claim 7 wherein applying said second force further includes applying said second force by a piezo actuator, with said piezo actuator containing a first end and a second end positioned opposite to each other, said first end being attached to said template and said second end being in contact with said substrate, with enlarging said piezo actuator causing said the plate to be pushed away from said substrate.

13. The method as recited in claim 12 wherein applying said second force further includes having said second end treated with a low surface energy layer.

14. A method of separating a template extending in a first plane from an imprinting layer extending in a second plane, said method comprising:
applying a first force to form an oblique angle between said first plane and said second plane to cause a wedge between said template and said imprinting layer at one end of a template-imprinting layer interface; and
applying a second force differing from said first force to increase a distance between said template and said imprinting layer so that said template is spaced-apart from said imprinting layer, with said first force and said second force being greater than zero.

15. The method as recited in claim 14 wherein applying said first force further includes causing said template to be tilted with respect to said substrate, with said substrate remaining stationary.

16. The method as recited in claim 14 wherein applying said first force to said template further includes causing said template to be tilted with respect to said substrate, with said template remaining stationary.

17. The method as recited in claim 14 wherein applying said second force to said template further includes applying said second force by a flexure system.

18. The method as recited in claim 14 wherein applying said second force further includes applying said second force by a piezo actuator, with said piezo actuator containing a first end and a second end positioned opposite to each other, said first end being attached to said template and said second end being in contact with said imprinting layer, with enlarging said piezo actuator causing said template to be pushed away from said imprinting layer.

19. The method as recited in claim 18 wherein applying said second force further includes having said second end is treated with a low surface energy layer.

20. The method as recited in claim 1 further including applying said first and second forces concurrently.

21. The method as recited in claim 7 further including applying said first and second forces concurrently.

22. The method as recited in claim 14 further including applying said first and second forces concurrently.

* * * * *